United States Patent
Wu et al.

(10) Patent No.: US 10,230,365 B2
(45) Date of Patent: Mar. 12, 2019

(54) BRIDGE LEG CIRCUIT ASSEMBLY AND FULL-BRIDGE CIRCUIT ASSEMBLY

(71) Applicant: General Electric Company, Schenectady, NY (US)

(72) Inventors: Tao Wu, Shanghai (CN); Fei Li, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/586,646

(22) Filed: May 4, 2017

(65) Prior Publication Data
US 2017/0324406 A1 Nov. 9, 2017

(30) Foreign Application Priority Data

May 4, 2016 (CN) .......................... 2016 1 0290259

(51) Int. Cl.
*H03K 17/66* (2006.01)
*H01L 23/482* (2006.01)
(Continued)

(52) U.S. Cl.
CPC ......... *H03K 17/66* (2013.01); *H01L 23/4821* (2013.01); *H01L 23/538* (2013.01);
(Continued)

(58) Field of Classification Search
CPC .... H03K 17/66; H03K 17/063; H03K 17/567; H03K 17/602; H03L 23/4821; H03L 23/538
(Continued)

(56) References Cited

U.S. PATENT DOCUMENTS 5,844,399 A  12/1998  Stuart
2005/0275381 A1  12/2005  Guang et al.
(Continued)

FOREIGN PATENT DOCUMENTS

WO  2014/197917 A1  12/2014

OTHER PUBLICATIONS

Extended European Search Report and Opinion issued in connection with corresponding EP Application No. 17168930.0 dated Oct. 11, 2017.
(Continued)

*Primary Examiner* — Thomas Skibinski
(74) *Attorney, Agent, or Firm* — GE Global Patent Operation

(57) ABSTRACT

A bridge leg circuit assembly comprising: a circuit board, a first active switch die, and a second active switch die. The circuit board having an insulating plate with a first and second side and a first and second conducting layer on the first and second sides of the insulating plate, respectively. The second conducting layer having a first and second conducting region that are insulated from each other. The first active switch die having an opposing first side, facing and coupled with the first conducting region, and an opposing second side, coupled with the second conducting region, which are embedded into the circuit board. The second active switch die having an opposing first side, coupled with the second conducting region, and an opposing second side, coupled with the first conducting layer, which are embedded into the circuit board.

4 Claims, 7 Drawing Sheets

(51) Int. Cl.
| | |
|---|---|
| *H03K 17/06* | (2006.01) |
| *H03K 17/567* | (2006.01) |
| *H03K 17/60* | (2006.01) |
| *H01L 23/538* | (2006.01) |
| *H01L 25/07* | (2006.01) |
| *H05K 1/18* | (2006.01) |
| *H05K 3/00* | (2006.01) |
| *H05K 1/05* | (2006.01) |
| *H05K 1/02* | (2006.01) |

(52) U.S. Cl.
CPC ......... *H01L 25/072* (2013.01); *H03K 17/063* (2013.01); *H03K 17/567* (2013.01); *H03K 17/602* (2013.01); *H05K 1/182* (2013.01); *H05K 3/0061* (2013.01); *H05K 1/0203* (2013.01); *H05K 1/05* (2013.01)

(58) Field of Classification Search
USPC .......... 327/365; 361/764; 257/690, 692, 712
See application file for complete search history.

(56) References Cited

U.S. PATENT DOCUMENTS

| | | |
|---|---|---|
| 2008/0251908 A1 | 10/2008 | Yang et al. |
| 2013/0119932 A1 | 5/2013 | Moon et al. |
| 2013/0234669 A1 | 9/2013 | Huang et al. |
| 2013/0314038 A1 | 11/2013 | Kardolus et al. |
| 2014/0042610 A1 | 2/2014 | Li et al. |
| 2014/0111121 A1 | 4/2014 | Wu |
| 2015/0078042 A1 | 3/2015 | Standing |
| 2015/0342055 A1* | 11/2015 | Arens ................. H01L 23/4952 361/764 |
| 2016/0005684 A1 | 1/2016 | Standing et al. |

OTHER PUBLICATIONS

Mathieu, "Design of an on-board charger for plug-in hybrid electrical vehicle (PHEV)", Chalmers, p. 15, 27 of 89 pages, 2009.

Kim et al., "Design and implementation of a high-efficiency on-board battery charger for electric vehicles with frequency control strategy", Vehicle Power and Propulsion Conference (VPPC), pp. 1-6, Sep. 2010.

Whitaker et al., "A High-Density, High-Efficiency, Isolated On-Board Vehicle Battery Charger Utilizing Silicon Carbide Power Devices", Power Electronics, IEEE Transactions on, vol. 29, Issue 5, pp. 2606-2617, Aug. 28, 2013.

Pan et al., "A High Power Density Integrated Charger for Electric Vehicles with Active Ripple Compensation", Mathematical Problems in Engineering, 18 pages, 2015.

* cited by examiner

BRIDGE LEG CIRCUIT ASSEMBLY AND FULL-BRIDGE CIRCUIT ASSEMBLY

TECHNICAL FIELD

Embodiments disclosed in the present invention relate to a bridge leg circuit assembly and a full-bridge circuit assembly.

BACKGROUND ART

Bridge leg circuit usually consists of two interconnected switching devices which are the basic units of a switching circuit. Existing bridge leg circuit assemblies are usually connected by discrete devices through wires or copper busbars, and switching circuits assembled using such bridge leg circuit assemblies are not only bulky and have low power density, but also have high parasitic inductance. A switching circuit usually has high switching frequency, and high parasitic inductance will cause substantial switching loss, leading to poor efficiency of the switching circuit.

Therefore, it is necessary to provide a new type of bridge leg circuit assembly, a new type of full-bridge circuit assembly and their manufacturing methods so as to resolve at least one of the problems as described above.

SUMMARY

A bridge leg circuit assembly comprising: a circuit board, a first active switch die, and a second active switch die. The circuit board consists of an insulating plate with a first side and a second side, a first conducting layer located on the first conducting layer of the first side of the insulating plate and a second conducting layer located on the second side of the insulating plate. The second conducting layer consists of a first conducting region and a second conducting region that are insulated from each other. The first active switch die consists of an opposing first side and an opposing second side which are embedded into the circuit board; the first side of the first active switch die is facing the first conducting region of the second conducting layer and coupled with the first conducting region, and the second side of the first active switch die is coupled with the second conducting region of the second conducting layer. The second active switch die consists of an opposing first side and an opposing second side which are embedded into the circuit board; the first side of the second active switch die is facing the second conducting region of the second conducting layer and coupled with the second conducting region, and the second side of the second active switch is coupled with the first conducting layer.

A full-bridge circuit assembly comprising: a circuit board, a first active switch die, a second active switch die, a third active switch die and a fourth active switch die. The circuit board consists of an insulating plate with a side and a second side, a first conducting layer located on the first side of the insulating plate and a second conducting layer located on the second side of the insulating plate. The second conducting layer consists of a first conducting region, a second conducting region and a third conducting region that are insulated from one another. The first active switch die consists of an opposing first side and an opposing second side which are embedded into the circuit board; the first side of the first active switch die is facing the first conducting region of the second conducting layer and coupled with the first conducting region, and the second side of the first active switch die is coupled with the second conducting region of the second conducting layer. The second active switch die consists of an opposing first side and an opposing second side which are embedded into the circuit board; the first side of the second active switch die is facing the second conducting region of the second conducting layer and coupled with the second conducting region, and the second side of the second active switch is coupled with the first conducting layer. The third active switch die consists of an opposing first side and an opposing second side which are embedded into the circuit board; the first side of the third active switch die is facing the first conducting region of the second conducting layer and coupled with the first conducting region, and the second side of the third active switch die is coupled with the third conducting region of the second conducting layer. The fourth active switch die consists of an opposing first side and an opposing second side which are embedded into the circuit board; the first side of the fourth active switch die is facing the third conducting region of the second conducting layer and coupled with the third conducting region, and the second side of the fourth active switch is coupled with the first conducting layer.

BRIEF DESCRIPTION OF THE DRAWINGS

These and other features, aspects and advantages of the present invention will be easier to understand when the following detailed description is read with reference to the accompanying drawings in which identical reference numbers are used throughout the drawings to refer to the identical parts.

DETAILED DESCRIPTION

Embodiments of the present invention will be described in detail below with reference to the accompanying drawings in order to assist those skilled in the art with understanding the subject matter claimed by the present invention. In the following detailed description of these specific embodiments, the present specification does not describe in detail any of the known functions or configurations to avoid unnecessary details that affect the disclosure of the invention.

Unless otherwise defined, the technical and scientific terms used in the claims and the specification are as they are usually understood by those skilled in the art to which the present invention pertains. "First", "second" and similar words used in the specification and the claims do not denote any order, quantity or importance, but are merely intended to distinguish between different constituents. The terms "one", "a" and similar words are not meant to be limiting, but rather denote the presence of at least one. "Comprising", "consisting of" and similar words mean that the elements or articles appearing before "comprising" or "consisting of" include the elements or articles and their equivalent elements appearing behind "comprising" or "consisting of", not excluding any other elements or articles. "Connected", "coupled" and similar words are not restricted to physical or mechanical connections, but may also include electrical connections, whether direct or indirect.

An embodiment of the present invention relates to a bridge leg circuit assembly.

Figure 1:
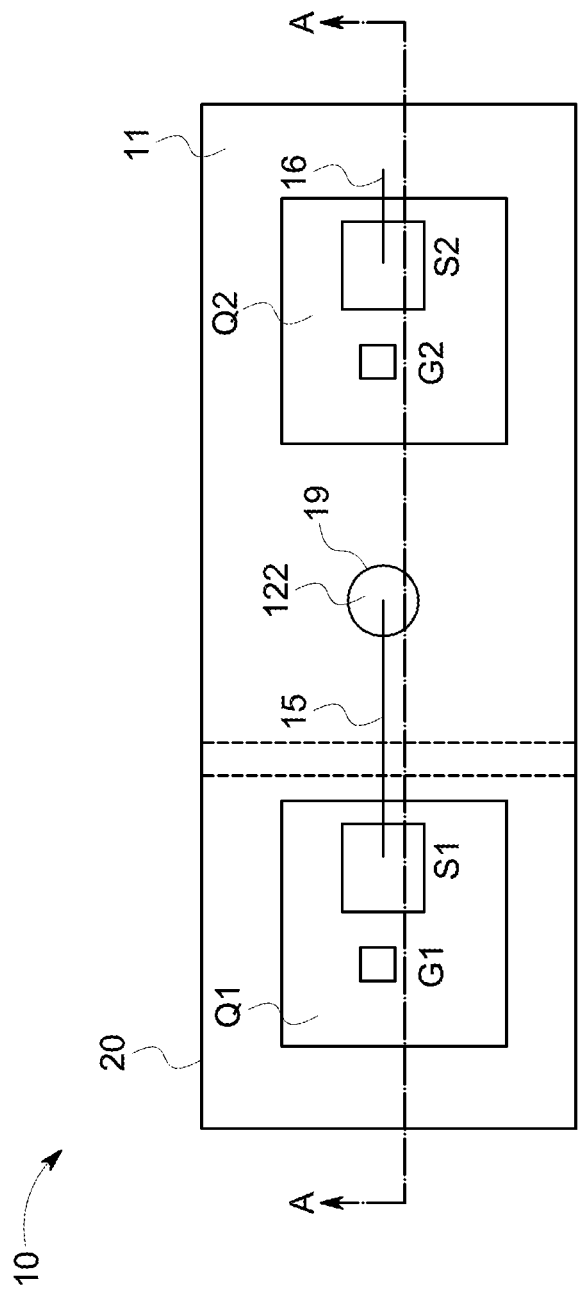
FIG. 1 is a top view of a bridge leg circuit assembly based on an embodiment of the present invention.

FIG. 1 is a top view of a bridge leg circuit assembly 10 based on a particular embodiment of the present invention. As seen in FIG. 1, the bridge leg circuit assembly 10 includes a circuit board 20, a first active switch die Q1 and a second active switch die Q2, and the first and second active switch dice Q1 and Q2 are embedded into a circuit board 20. The active switch die mentioned here refers to a switching chip that does not contain an external package structure such as a pin, and has a tabular structure with opposing sides. The active switch die can be a die for an insulated gate bipolar transistor (IGBT), or a die for a metal-oxide semiconductor field effect transistor (MOSFET).

Figure 2:
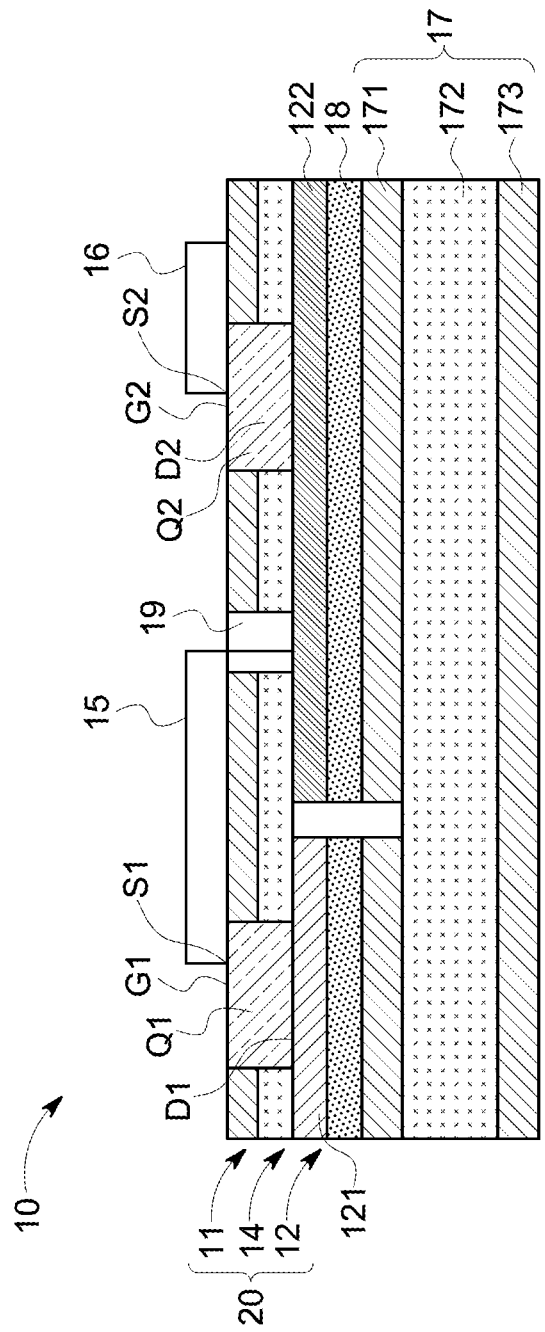
FIG. 2 is a cross-sectional view along line A-A of the bridge leg circuit assembly in FIG. 1.

As seen in FIG. 2, the circuit board 20 includes an insulating plate 14 consisting of a first side and a second side, a first conducting layer 11 and a second conducting layer 12. The first conducting layer 11 is located on the first side of the insulating plate 14 and the second conducting layer is located on the second side of the insulating plate 14. The second conducting layer 12 consists of a first conducting region 121 and a second conducting region 122 which are insulated from each other. In the embodiment shown in FIG. 2, there is a gap between the first and second conducting regions 121 and 122 to isolate the first and second conducting regions. In some embodiments, the circuit board is a printed circuit board, and the first and second conducting layers are attached to the first and second sides of the insulating plate, respectively.

The first active switch die Q1 consists of the opposing first and second sides which are embedded into the circuit board, and the first side of the first active switch die Q1 is facing the first conducting region 121 of the second conducting layer and is coupled with the first conducting region 121. Wherein, the first side of the first active switch die can be coupled with the first conducting region 121 through direct contact, and can also be coupled with the first conducting region 121 through a connector (not shown).

The second side of the first active switch die is coupled with the second conducting region 122. As shown in FIG. 2, the assembly 10 includes a first connector 15 for coupling the second face of the first active switch die with the second conducting region 122, which consists of a first end coupled with the second side of the first active switch die and a second end coupled with the second conducting region 122. In some embodiments, the circuit board 20 has a channel 19 leading to the second conducting region, and the second end of the first connector 15 is coupled to the second conducting region 122 through channel 19.

Similarly, the second active switch die Q2 consists of the opposing first and second sides embedded into the circuit board 20, and the first side of the second active switch die is facing the second conducting region 122 of the second conducting layer and coupled with the second conducting region 122. Wherein, the first side of the second active switch die can be coupled with the second conducting region 122 through direct contact, and can also be coupled with the first conducting region 122 through a connector (not shown).

The second side of the second active switch die is coupled with the first conducting layer 11. As shown in FIG. 2, the assembly 10 further consists of a second connector 16 used for coupling the second side of the second active switch die and the first conducting layer 11, which consists of a first end coupled with the second side of the second active switch die, and a second end coupled with the first conducting layer.

In some embodiments, the first active switch die Q1 consists of a first drain terminal D1, a first source terminal S1 and a first gate terminal G1. Wherein, the first drain terminal D1 is located on the first side of the first active switch die Q1 and is coupled with the first conducting region 121. The first source terminal S1 is located on the second side of the first active switch die Q1, which is coupled with the second conducting region 122 through the first connector 15. The first gate terminal G1 can be located on the same side as the first drain terminal D1, or on the same side as the first source terminal S1; in the embodiment of FIG. 2, the first gate terminal G1 is located on the second side of the first active switch die Q1, and the first gate terminal G1 can be connected to a driver circuit (not shown) through a lead wire.

The second active switch die Q2 consists of a second drain terminal D2, a second source terminal S2 and a second gate terminal G2. Wherein, the second drain terminal D2 is located on the first side of the second active switch die and coupled with the second conducting region 122, and the second drain terminal D2 is substantially coupled with the first source terminal S1 through the second conducting region 122 and the first connector 15. The second source terminal S2 is located on the second side of the second active switch die, which is coupled with the first conducting layer 11 through the second connector 16. The second gate terminal G2 can be located on the same side as the second drain terminal D2, or on the same side as the second source terminal S2; in the embodiment of FIG. 2, the second gate terminal G2 is located on the second side of the second active switch die Q2, and the second gate terminal G2 can be connected to a driver circuit (not shown) through a lead wire.

In some embodiments, when the bridge leg circuit assembly 10 is in operation, the first conducting layer 11 is coupled with the negative electrode of the power supply, and the first conducting region 121 of the second conducting layer is coupled with the positive electrode of the power supply. The current flows into the first drain terminal D1 of the first active switch die Q1 through the first conducting region 121, and then flows out from the first source terminal S1, and then flows into the second drain terminal D2 through the first connector 15 and the second conducting region 122, and then flows out from the second source S2, and finally flows back into the negative electrode of the power supply through the second connector 16 and the first conducting layer 11. In other embodiments, the first conducting layer 11 can be coupled with the positive electrode of the power supply, and the first conducting region 121 of the second conducting layer can be coupled with the negative electrode of the power supply.

Continuing to refer to FIG. 2, the assembly 10 also consists of a heat dissipation layer 17 for providing heat dissipation for the first and second active switch dice. The heat dissipation layer 17 is adhered to either side of the circuit board 20. As shown in FIG. 2, the heat dissipation layer 17 consists of a first metal layer 171, a thermal conducting layer 172, and a second metal layer 173, and the first and second metal layers 171 and 173 are located on both sides of the thermal conducting layer 172, respectively. In the embodiment shown in FIG. 2, the heat dissipation layer 17 is located on one side of the circuit board 20 near the second conducting layer 12. The assembly 10 also includes a solder layer 18 for bonding the heat dissipation layer 17 together with the circuit board 20.

In the technical solution disclosed in the present invention, the first and second active switch dice are directly embedded into the circuit board and are coupled to each other through the conducting layers and the connectors, thus avoiding the use of pins as well as shortening the distance between semiconductor chips, reducing the parasitic inductance in the circuit, and reducing switching loss. In the disclosed embodiment of the present invention, the parasitic inductance in the circuit can be reduced to 3.7 nH. On the other hand, the first and second active switch die are placed horizontally, which is very advantageous for heat dissipation because the heat of each active switch die can be conducted directly to the heat dissipation layer via the conducting layer.

Figure 3:
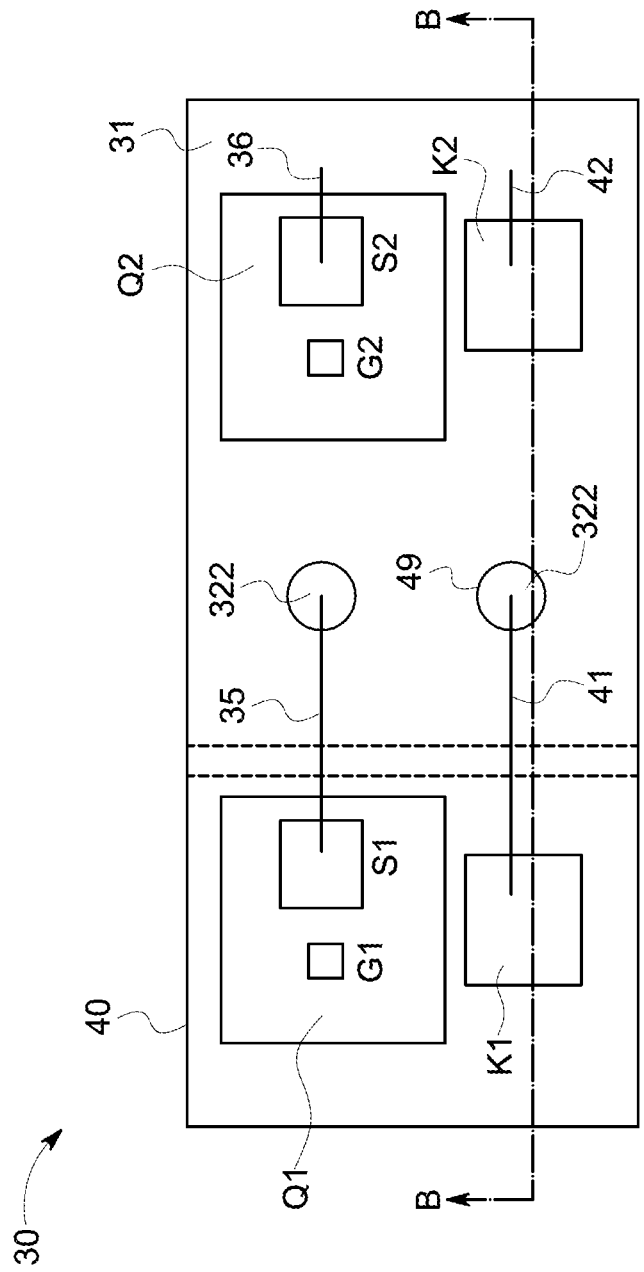
FIG. 3 is a top view of a bridge leg circuit assembly based on another embodiment of the present invention.
Figure 4:
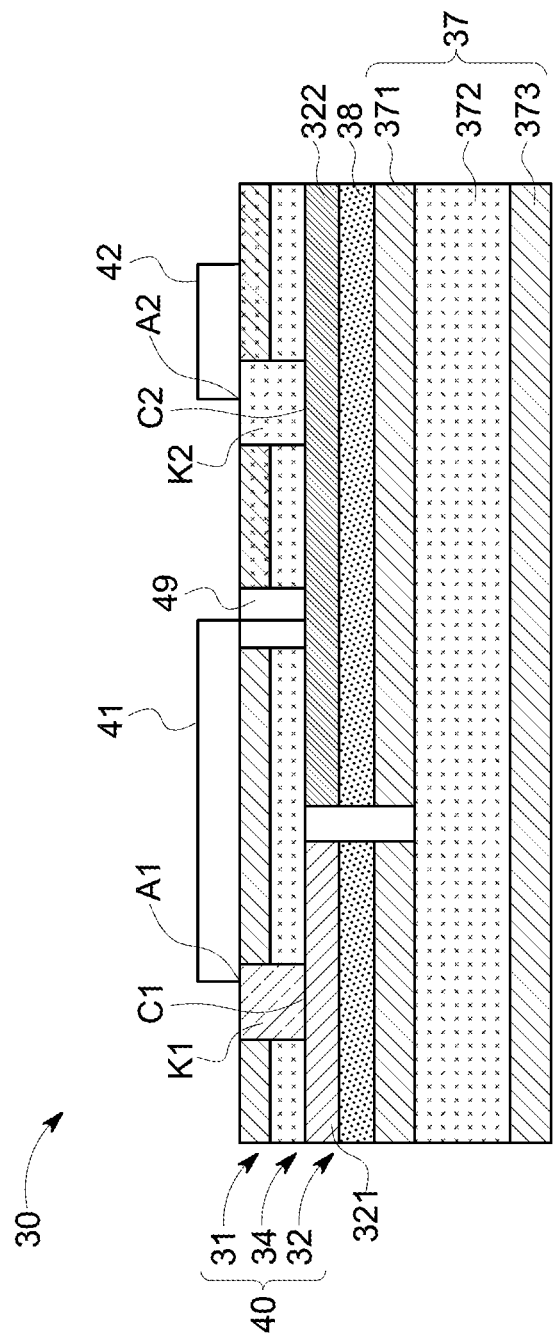
FIG. 4 is a cross-sectional view along line B-B of the bridge leg circuit assembly in FIG. 3.

FIG. 3 is a top view of a bridge leg circuit assembly 30 based on another embodiment of the present invention. FIG. 4 is a cross-sectional view along line B-B of the bridge leg circuit assembly 30 in FIG. 3. Similar to the bridge leg circuit assembly 10 in FIGS. 1 and 2, the bridge circuit assembly 30 consists of a circuit board 40, a first active switch die Q1, a second active switch die Q2, a first connector 35 and a second connector 36, wherein the circuit board 40 consists of an insulating plate 34, a first conducting layer 31 and a second conducting layer 32, wherein the second conducting layer 32 consists of a first conducting region 321 and a second conducting region 322. The configurations and functions of the abovementioned components are similar to those in the bridge leg circuit assembly 10 and will not be described here. Unlike the bridge leg circuit assembly 10, the bridge circuit assembly 30 consists of a first diode die D1 and a second diode die D2, connected to the first and second active switch dice Q1 and Q2 in parallel, respectively. The function of the first and second diode dice is to act as a flyback diode for the reverse current. The diode die referred to herein refers to a diode chip that does not contain an external package structure such as a pin, and has a tabular structure with opposite sides, while the anode and cathode of the diode are located on both sides of the diode die. In this disclosure, the side on which the diode anode is located is defined as the "anode side", while the side on which the diode cathode is located is defined as the "cathode side".

The first diode die K1 consists of a first cathode side and a first anode side embedded into the circuit board 40; the first cathode side is facing the first conducting region 321 and coupled with the first conducting region 321, and the first anode side is coupled with the second conducting region 322. In particular, the first cathode C1 on the first cathode side is coupled with the first conducting region 321, and the first anode A1 on the first anode side is coupled with the second conducting region 322. In some embodiments, the assembly 30 consists of a third connector 41 for coupling the first anode side and the second conducting region 322, which has a first end coupled with the first anode side and a second end coupled with the second conducting region 322.

In some embodiments, the circuit board 40 consists of a channel 49 leading to the second conducting region 322 for passing the second end of the third connector 41 therethrough, followed by coupling with the second conducting region 322.

The second diode die K2 consists of opposing second cathode side and second anode side embedded into the circuit board 40; the second cathode side is facing the second conducting region 322 and coupled with the second conducting region, and the second anode side is coupled with the first conducting layer 31. In particular, the second cathode C2 on the second cathode side is coupled with the second conducting region 322, and the second anode A2 on the second anode side is coupled with the first conducting layer 31. In some embodiments, the assembly 30 consists of a fourth connector 42 for coupling the second anode side and the first conducting layer 31, which has a first end coupled to the second anode side and a second end coupled with the first conducting layer 31.

Another aspect of the present invention relates to a full-bridge circuit assembly comprising two parallel bridges.

Figure 5:
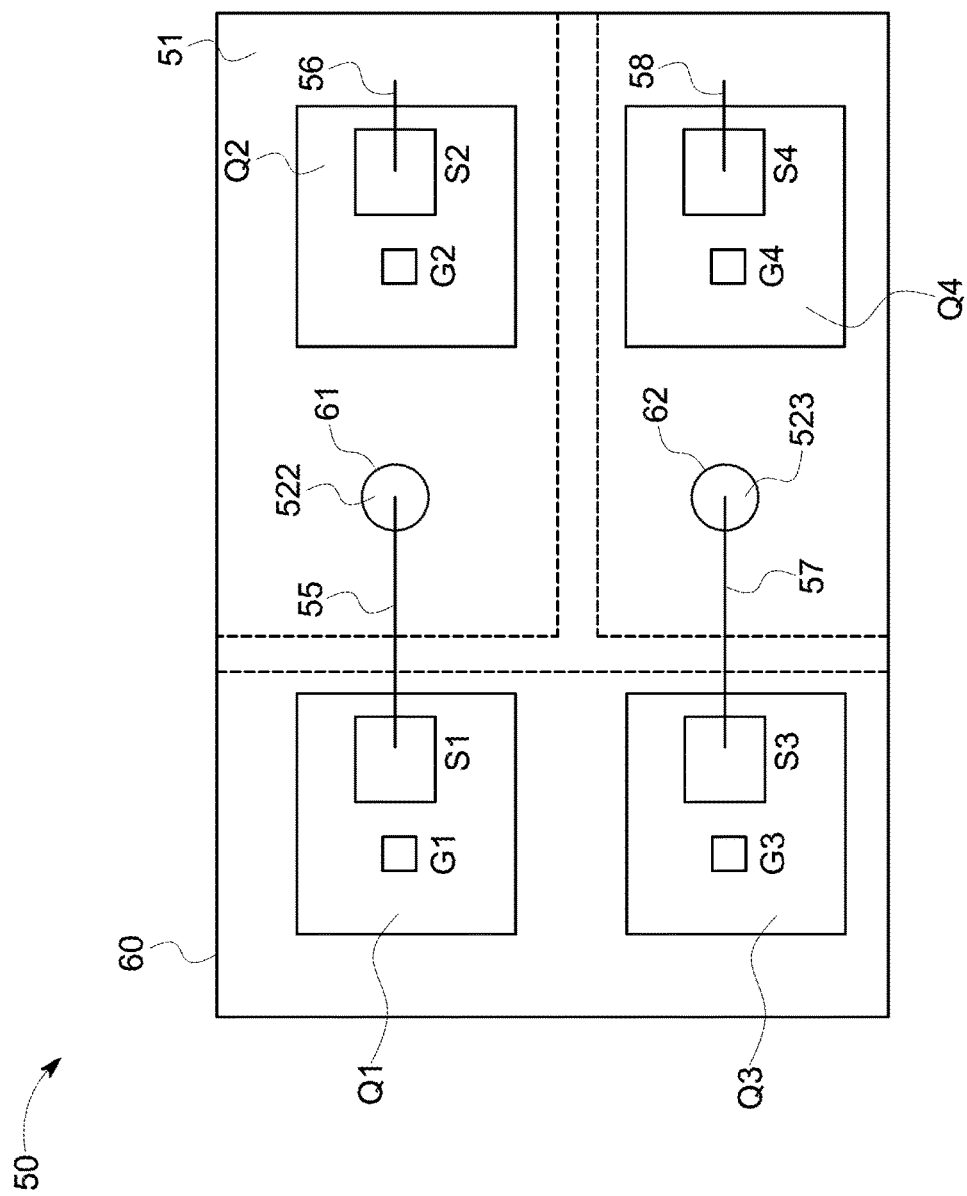
FIG. 5 is a top view of a full-bridge circuit assembly based on an embodiment of the present invention.
Figure 6:
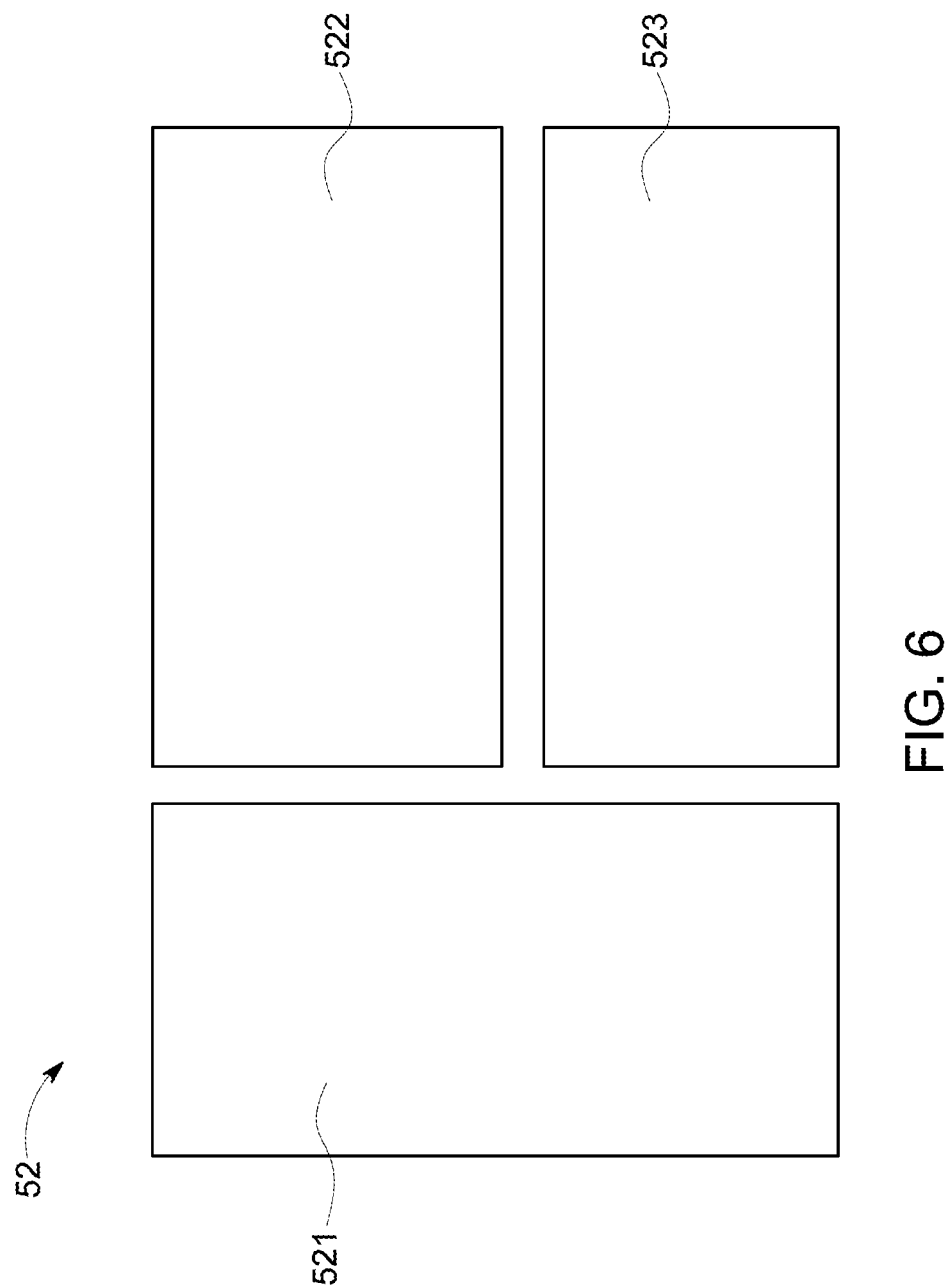
FIG. 6 is a schematic view of the second conducting layer of the full-bridge circuit assembly in FIG. 5.

FIG. 5 is a top view of a full-bridge circuit assembly 50 based on an embodiment of the present invention. FIG. 6 is a schematic view of the second conducting layer 52 of the full-bridge circuit assembly 50 in FIG. 5. Referring to FIGS. 5 and 6, the full-bridge circuit assembly 50 consists of a circuit board 60, a first active switch die Q1, a second active switch die Q2, a third active switch die Q3, a fourth active switch die Q4, a first connector 55, a second connector 56, a third connector 57 and a fourth connector 58. The first, second, third and fourth active switch dice are embedded into the circuit board 60. The circuit board 60 consists of an insulating plate 54, a first conducting layer 51 and a second conducting layer 52. The first conducting layer 51 is located on the first side of the insulating plate 54, and the second conducting layer 52 is located on the second side of the insulating plate 54. The second conducting layer 52 consists of a first conducting region 521, a second conducting region 522, and a third conducting region 523 insulated from one another.

The first active switch die Q1 consists of opposing first and second sides embedded into the circuit board 60; the first side of the first active switch die is facing the first conducting region 521 of the second conducting layer and coupled with the first conducting region 521, and the second face of the first active switch die is coupled with the second conducting region 522 through the first connector 55. The first connector 55 consists of a first end coupled with a second side of the first active switch die and a second end coupled with the second conducting region 522. In some embodiments, the circuit board 60 has a channel 61 leading to the second conducting region 522 to pass the second end of the first connector 55 therethrough.

In some embodiments, the first active switch die Q1 consists of a first drain terminal D1 located on the first side of the first active switch die as well as a first source terminal S1 and a first gate terminal G1 located on a second side of the first active switch die; the first drain terminal D1 is coupled with the first conducting region 521, and the first source terminal S1 is coupled with the second conducting region 522 through the first connector 55. The first gate terminal G1 can be coupled with a driver circuit (not shown).

The second active switch die Q2 consists of opposing first and second sides embedded into the circuit board 60; the first face of the second active switch die is facing the second conducting region 522 of the second conducting layer 52 and coupled with the second conducting region 522, and the second side of the second active switch die is coupled with the first conducting layer 51 through the second connector 56. The second connector 56 consists of a first end coupled with a second side of the second active switch die and a second end coupled with the first conducting layer 51.

In some embodiments, the second active switch die Q2 consists of a second drain terminal D2 located on the first side of the second active switch die and a second source terminal S2 and second gate terminal G2 located on the second side of the second active switch die; the second drain terminal D2 is coupled with the first source terminal S1 through the second conducting region 522 and the first connector 55, and the second source terminal S2 is coupled with the first conducting layer 51 through the second connector 56. The second gate terminal G2 can be coupled with a driver circuit (not shown).

The third active switch die Q3 consists of opposing first and second sides embedded into the circuit board 60; the first face of the third active switch die is facing the first conducting region 521 of the second conducting layer 52 and coupled with the first conducting region 521, and the second face of the third active switch die is coupled with the third conducting region 523 through the third connector 57. The third connector 57 consists of a first end coupled with the second side of the third active switch die and a second end coupled with the third conducting region 523. In some embodiments, the circuit board 60 consists of a channel 62 leading to the third conducting region 523 to pass the second end of the third connector 57 therethrough.

In some embodiments, the third active switch die Q3 consists of a third drain terminal D3 located on the first side of the third active switch die as well as a third source terminal S3 and a third gate terminal G3 located on the second side of the third active switch die; the third drain terminal D3 is coupled with the first conducting region 521, and the third source terminal S3 is coupled with the third conducting region 523 through the third connector 57. The third gate terminal G3 can be coupled with a driver circuit (not shown).

The fourth active switch die Q4 consists of opposing first and second sides embedded into the circuit board 60; the first face of the fourth active switch die Q4 is facing the third conducting region 523 of the second conducting layer 52 and coupled with the third conducting region 523, and the second side of the fourth active switch die is coupled with the first conducting layer 51 through the fourth connector 58. The fourth connector 58 consists of a first end coupled with the second side of the fourth active switch die and a second end coupled with the first conducting layer 51.

In some embodiments, the fourth active switch die Q4 consists of a fourth drain terminal D4 located on the first side of the fourth active switch die as well as a fourth source terminal S4 and a fourth gate terminal G4 located on the second side of the fourth active switch die. The fourth drain terminal D4 is coupled with the third source terminal S3 through the third conducting region 523 and the third connector 57. The fourth source terminal S4 is coupled with the first conducting layer 51 through the fourth connector 58. The fourth gate terminal G4 can be coupled with a driver circuit (not shown).

The present invention can also relate to a circuit assembly consisting of three or more bridge legs in parallel with one another in a manner similar to that of the full-bridge circuit assembly described above.

Figure 7:
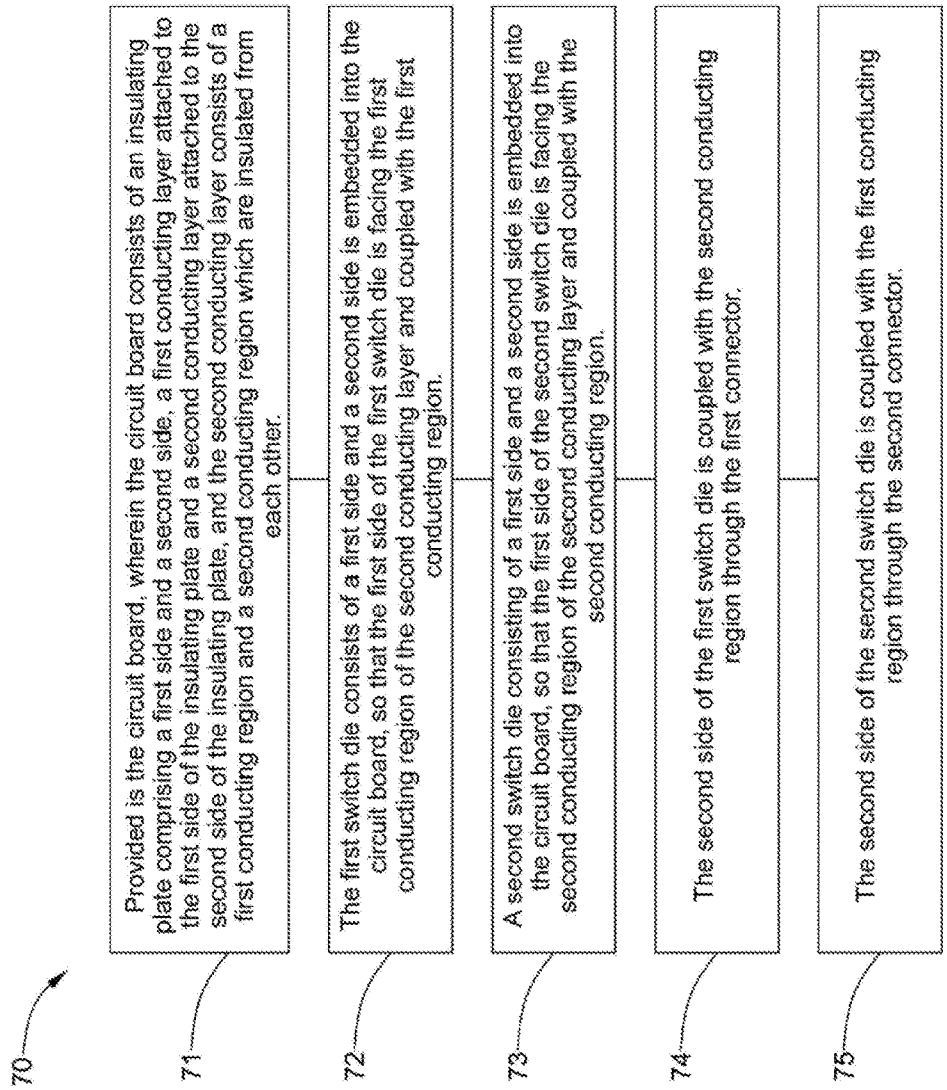
FIG. 7 is a schematic flow diagram of a method of manufacturing a bridge leg circuit assembly based on a particular embodiment of the present invention.

Embodiments of the present invention also relate to a method 70 of manufacturing a bridge leg circuit assembly. As shown in FIG. 7, the method 70 consists of the following steps.

In step 71, a circuit board is provided, wherein the circuit board consists of an insulating plate comprising a first side and a second side, a first conducting layer attached to the first side of the insulating plate and a second conducting layer attached to the second side of the insulating plate. The second conducting layer consists of a first conducting region and a second conducting region which are insulated from each other.

In step 72, a first active switch die consisting of a first side and a second side is embedded in the circuit board, so that the first side of the first active switch die is facing the first conducting region of the second conducting layer and coupled with the first conducting region.

In step 73, the second active switch die consisting of a first side and a second side is embedded into the circuit board, so that the first side of the second active switch die is facing the second conducting region of the second conducting layer and coupled with the second conducting region.

In some embodiments, the first and second active switch dice are embedded into the circuit board from the side of the circuit board near the first conducting layer so they are located just on the second conducting layer. In some embodiments, the first active switch die is laminated onto the first conducting region, and the first side of the first active switch die is in electrical contact with the first conducting region. The second active switch die is laminated onto the second conducting region and the first side of the second active switch die is in electrical contact with the second conducting region. In other embodiments, the first side of the first and second active switch dice can also be coupled with the first and second conducting regions, respectively, by soldering.

In step 74, the second side of the first active switch die is coupled with the second conducting region by the first connector.

In step 75, the second side of the second active switch die is coupled with the first conducting layer by a second connector.

The abovementioned method utilizes the method of embedding the active switch die directly into the circuit board, avoiding the use of chip pins as well as shortening the distance between chips, reducing the parasitic inductance in the circuit to 3.7 nH, and greatly reducing switching loss.

Methods similar to the method described above can be used to manufacture the bridge leg circuit assembly as shown in the embodiments of FIGS. 3 and 4, as well as the full-bridge circuit assembly as shown in the embodiments of FIGS. 5 and 6, and will not be described here.

While the present invention has been described in detail with reference to specific embodiments thereof, it will be understood by those skilled in the art that many modifications and variations can be made in the present invention. It is, therefore, to be understood that the appended claims are intended to cover all such modifications and variations insofar as they are within the true spirit and scope of the invention.

The invention claimed is:

1. A packaging assembly of a full-bridge circuit, comprising:
   a circuit board, comprising:
      an insulating board have a first side and a second side,
      a first conducting layer on the first side of the insulating board, and
      a second conducting layer on the second side of the insulating board and comprising a first conducting area, a second conducting area and a third conducting area which are insulated from each other;
   a first active switch bare die comprising a first side and a second side which are opposite to each other, wherein the first active switch bare die is embedded in the circuit board with the first side of the first active switch bare die facing to and coupled with the first conducting area of the second conducting layer, and the second side of the first active switch bare die coupled with the second conducting area of the second conducting layer;

a second active switch bare die comprising a first side and a second side which are opposite to each other, wherein the second active switch bare die is embedded in the circuit board with the first side of the second active switch bare die facing to and coupled with the second conducting area of the second conducting layer, and the second side of the second active switch bare die coupled with the first conducting layer;

a third active switch bare die comprising a first side and a second side which are opposite to each other, wherein the third active switch bare die is embedded in the circuit board with the first side of the third active switch bare die facing to and coupled with the first conducting area of the second conducting layer, and the second side of the third active switch bare die coupled with the third conducting area of the second conducting layer; and a fourth active switch bare die comprising a first side and a second side which are opposite to each other, wherein the fourth active switch bare die is embedded in the circuit board with the first side of the fourth active switch bare die facing to and coupled with the third conducting area of the second conducting layer, and the second side of the fourth active switch bare die coupled with the first conducting layer.

2. The packaging assembly according to claim 1, wherein the first conducting layer is coupled to a cathode of a power source, and the first conducting area of the second conducting layer is coupled to an anode of the power source.

3. The packaging assembly according to claim 1, further comprising:
   a first connector comprising a first end coupled with the second side of the first active switch bare die and a second end coupled with the second conducting area;
   a second connector comprising a first end coupled with the second side of the second active switch bare die and a second end coupled with the first conducting layer;
   a third connector comprising a first end coupled with the second side of the third active switch bare die and a second end coupled with the third conducting area; and
   a fourth connector comprising a first end coupled with the second side of the fourth active switch bare die and a second end coupled with the first conducting layer.

4. The packaging assembly according to claim 3, wherein the first active switch bare die comprises:
   a first drain on the first side of the first active switch bare die and coupled with the first conducting area, and
   a first source on the second side of the first active switch bare die;
the second active switch bare die comprises:
   a second drain on the first side of the second active switch bare die and coupled to the first source via the second conducting area and the first connector, and
   a second source on the second side of the second active switch bare die and coupled to the first conducting layer via the second connector;
the third active switch bare die comprises:
   a third drain on the first side of the third active switch bare die and coupled with the first conducting area, and
   a third source on the second side of the third active switch bare die; and
the fourth active switch bare die comprises:
   a fourth drain on the first side of the fourth active switch bare die and coupled to the third source via the third conducting area and the third connector, and
   a fourth source on the second side of the fourth active switch bare die and coupled to the first conducting layer via the fourth connector.

* * * * *